(12) United States Patent
Hu et al.

(10) Patent No.: US 12,277,984 B2
(45) Date of Patent: Apr. 15, 2025

(54) BLOCK FAMILY ERROR AVOIDANCE BIN DESIGNS ADDRESSING ERROR CORRECTION DECODER THROUGHPUT SPECIFICATIONS

(71) Applicant: Micron Technology, Inc., Boise, ID (US)

(72) Inventors: Guang Hu, Mountain View, CA (US); Nicola Ciocchini, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/231,514

(22) Filed: Aug. 8, 2023

(65) Prior Publication Data

US 2024/0071547 A1 Feb. 29, 2024

Related U.S. Application Data

(60) Provisional application No. 63/400,586, filed on Aug. 24, 2022.

(51) Int. Cl.

| | |
|---|---|
| *G11C 29/32* | (2006.01) |
| *G06F 3/06* | (2006.01) |
| *G06F 11/07* | (2006.01) |
| *G11C 16/34* | (2006.01) |
| *G11C 29/50* | (2006.01) |
| *G11C 29/52* | (2006.01) |
| *G11C 29/56* | (2006.01) |

(52) U.S. Cl.
CPC .............. *G11C 29/32* (2013.01); *G06F 3/064* (2013.01); *G06F 11/076* (2013.01); *G11C 16/3404* (2013.01); *G11C 16/349* (2013.01); *G11C 29/50* (2013.01); *G11C 29/52* (2013.01); *G11C 29/56008* (2013.01)

(58) Field of Classification Search
CPC ... G11C 16/349; G11C 16/3404; G11C 29/52; G11C 29/50; G11C 29/56008; G11C 29/32; G06F 3/064; G06F 11/076
See application file for complete search history.

(56) References Cited

U.S. PATENT DOCUMENTS

| | | | |
|---|---|---|---|
| 2015/0179284 A1* | 6/2015 | Alrod | G06F 11/076 714/704 |
| 2017/0255403 A1* | 9/2017 | Sharon | G06F 3/064 |
| 2021/0191617 A1* | 6/2021 | Sheperek | G06F 12/0246 |

\* cited by examiner

*Primary Examiner* — April Y Blair
*Assistant Examiner* — Sazzad Hossain
(74) *Attorney, Agent, or Firm* — Lowenstein Sandler LLP

(57) ABSTRACT

A memory device includes a memory array and control logic operatively coupled with the memory array to perform operations including maintaining a set of bins, each bin of the set of bins defining a respective grouping of memory arrays based on elapsed time since programming, wherein each bin of the set of bins is assigned a respective read level offset to achieve a bit error rate satisfying a threshold condition for an error correction decoder throughput specification, receiving a request to perform a read operation addressing the memory array, and causing the read operation to be performed based on the set of bins.

20 Claims, 11 Drawing Sheets

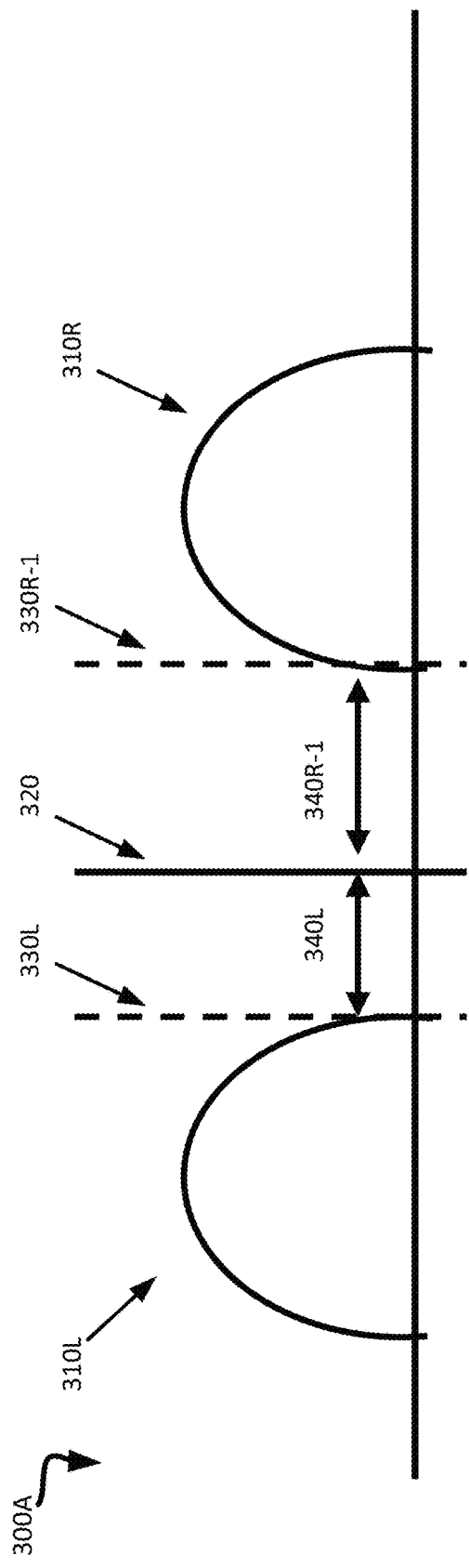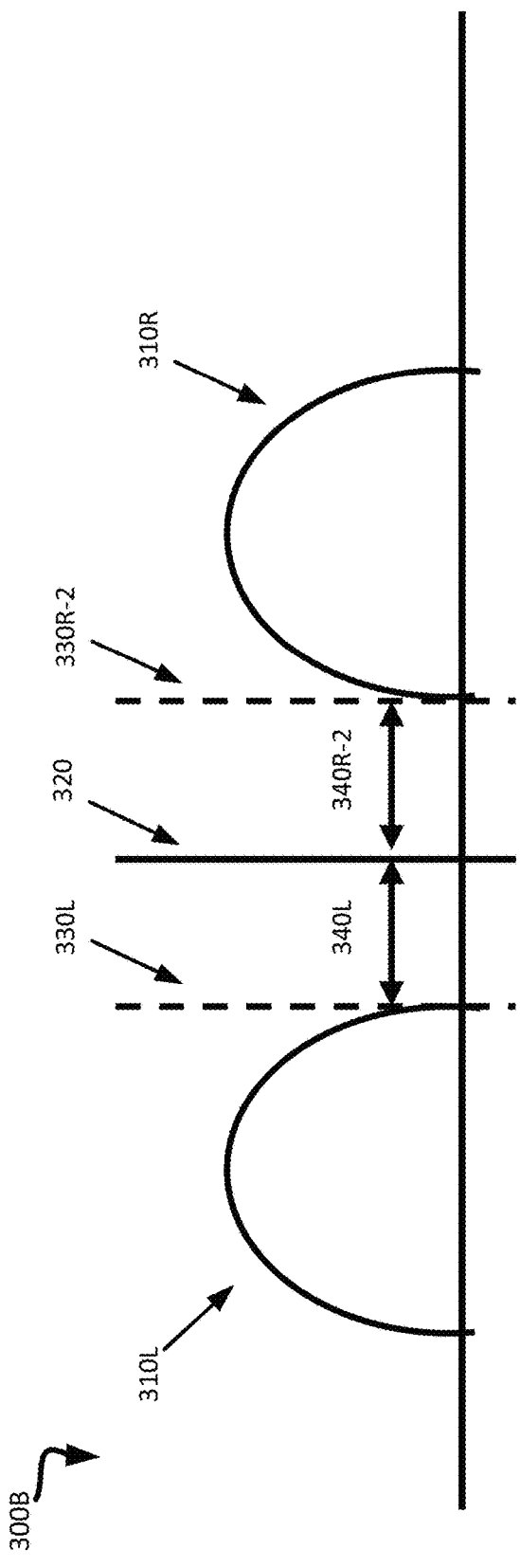

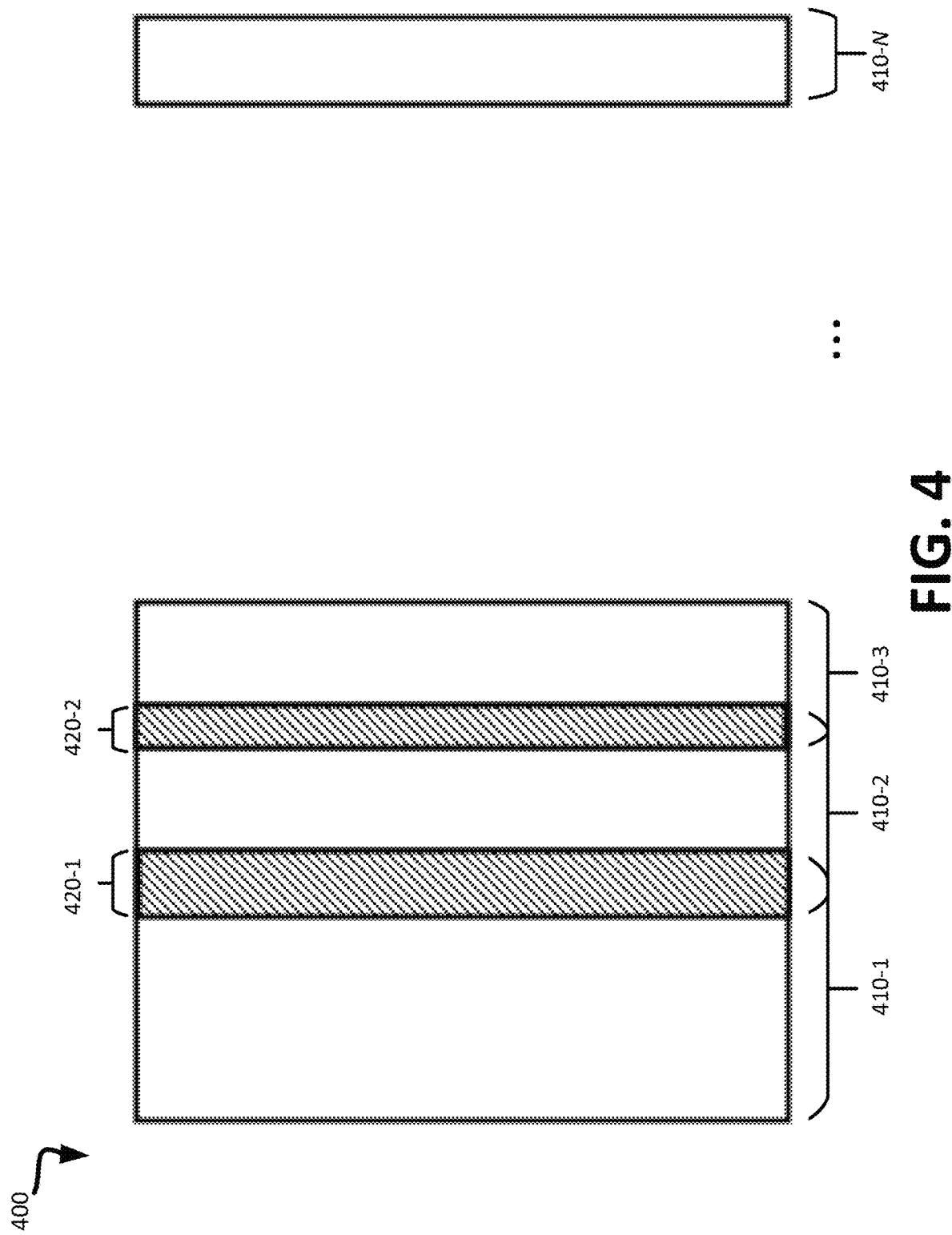

BLOCK FAMILY ERROR AVOIDANCE BIN DESIGNS ADDRESSING ERROR CORRECTION DECODER THROUGHPUT SPECIFICATIONS

CROSS-REFERENCE TO RELATED APPLICATION(S)

The present application claims the benefit of U.S. Provisional Application 63/400,586, filed on Aug. 24, 2022 and entitled "BLOCK FAMILY ERROR AVOIDANCE BIN DESIGNS ADDRESSING ERROR CORRECTION DECODER THROUGHPUT SPECIFICATIONS", the entire contents of which are incorporated by reference herein.

TECHNICAL FIELD

Embodiments of the disclosure relate generally to memory sub-systems, and more specifically, relate to implementing block family error avoidance (BFEA) bin designs address error correction decoder throughput specifications.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 3A-3B are diagrams of threshold voltage distributions illustrating an example implementation of block family error avoidance (BFEA) bin designs addressing error correction decoder throughput specifications, in accordance with some embodiments of the present disclosure.

FIG. 4 is a diagram of an example bin design layout for addressing error correction decoder throughput specifications, in accordance with some embodiments of the present disclosure.

DETAILED DESCRIPTION

Figure 1A:
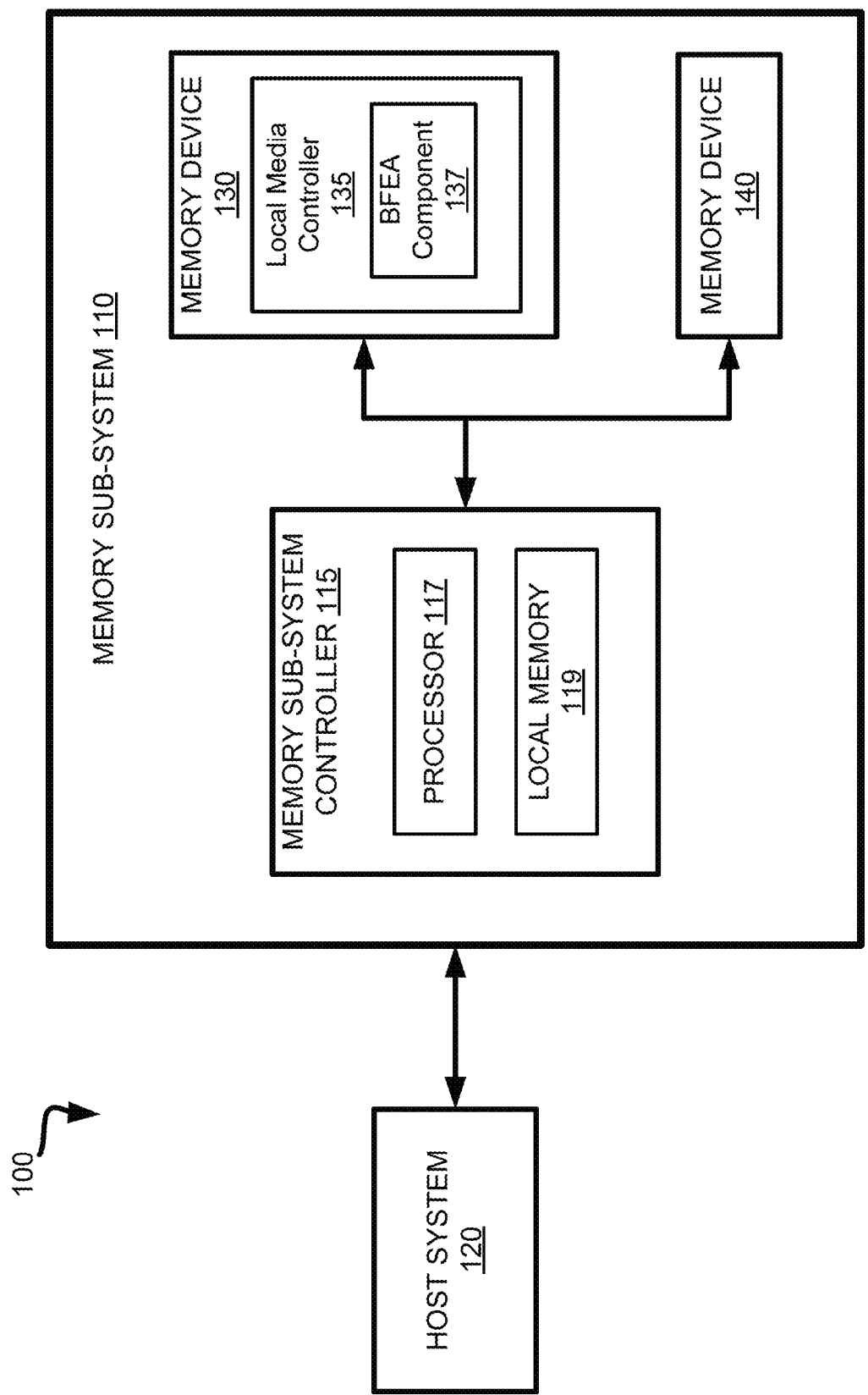
FIG. 1A illustrates an example computing system that includes a memory sub-system, in accordance with some embodiments of the present disclosure.

Aspects of the present disclosure are directed to implementing block family error avoidance (BFEA) bin designs addressing error correction decoder throughput specifications. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g. oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T,V_T+dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

As memory cell geometries become smaller and data is repeatedly written and erased in a memory device, such as a flash memory, the memory device may be more susceptible to errors due to various types of noise and disturb mechanisms inherent within the memory cell, which may be exacerbated with repeated programming. As a result, the raw bit error rates (RBERs) for the memory device can increase over time. Given this pattern, the end-of-life RBERs for these devices are much higher as compared to the beginning-of-life RBERs for the respective devices.

To address read errors, a memory sub-system may use an error correction technique to correct errors and verify that the data written into the memory device is the same as the data being read from the respective memory device. In some embodiments, the error correction technique can include a low-density parity check (LDPC). For example, an encoder (e.g., LDPC encoder) can be used to encode data being written to a memory device to generate a codeword (e.g., compute parity bits). A codeword can include a particular amount of data which may correspond to a data transfer size. A codeword can include additional digits as a result of encoding, such as parity digits. For example, a codeword can include raw data ("hard data") initially determined by a hard read. A decoder (e.g., LDPC decoder) can receive the codeword attempt to decode the codeword. Along with the hard data, a decoder can receive soft data that corresponds to the hard data of the codeword (e.g., indicates confidence information about the hard data). The soft data can be determined from soft read(s) of a memory cell (following a hard read of the memory cell) to determine a bit of the codeword. The encoding and decoding processes performed by the respective encoder and decoder can be such that errors in the codeword can be detected and/or corrected by during the decoding process. Illustratively, the encoder can receive, from a host device, k digits of data and generate a codeword including n digits of data (i.e., an n-digit codeword). For example, a digit of data can be a binary digit (i.e., bit). The n-digit codeword can uniquely correspond to the k digits of data, and the n-digit codeword can be stored in the memory sub-system in place of the k digits of data.

One phenomenon observed in memory devices is slow charge loss (SCL). Charge loss due to SCL can occur as a function of elapsed time since programming and/or temperature. Charge loss can cause $V_T$ distribution shift, in which $V_T$ distributions shift towards lower voltage levels. That is, the $V_T$ distribution shift can be proportional to the elapsed time from a programming operation to a read operation and/or temperature. Charge loss and the corresponding $V_T$ distribution shift can, over time, lead to increasing bit error rates (e.g., raw bit error rates (RBERs)) that require increasing amounts of error correction to address, and thus system resources. For example, trigger rate refers to a rate of read retry errors due to the failure to decode during an initial read. The trigger rate (TR) can illustratively be calculated as TR=N/T, where N is the number of read errors and T is the total number of reads. As used herein, trigger rate margin (TRM) refers to a threshold amount of trigger rate to meet system performance specification (e.g., a buffer of fail bits where the system can still perform acceptably). For example, if the system can tolerate an error of 100 fail bits, then the read level setting can be set at the level where the number of fail bits is 50 or fewer bits, which corresponds to 50 bits of buffer (2× buffer or about 6 dB).

Depending on the system workload, it is possible to have variations in the elapsed time since programming across blocks. These variations in the elapsed time since programming can result in varying, non-uniform $V_T$ distribution shifts of respective blocks if the programming of blocks is spaced significantly in time. As a result of these non-uniform $V_T$ distribution shifts, it can be difficult to determine or predict an optimal read level offset that can be applied to the majority of the blocks to address charge loss without compromising performance.

Media management techniques can be used to track center read level changes and charge loss to improve system efficiency and performance. In some memory devices, one media management technique to track charge loss is block family error avoidance (BFEA). To implement BFEA, each block of a memory device (i.e., memory array) can be assigned to a respective predefined block family (BF), also referred to herein a BFEA bin. Each BFEA bin can define a grouping of blocks that having a substantially similar elapsed time since programming (i.e., are programmed at or around the same time).

As mentioned above, the amount of charge loss of a block can be a function of the elapsed time from a programming operation and/or temperature. To generate the BFEA bins, a memory device having an initial amount of charge can be stored at a certain temperature for a certain amount of time. After the amount of time, the charge loss can be measured by comparing the difference between the initial amount of charge and a final amount of charge after being removed from the storage. As an illustrative example, a memory device can be stored for one week at 85° C. The measured charge loss can be divided among a number of BFEA bins, where each BFEA bin has a bin width defined by a respective portion of the measured charge loss (i.e., the BFEA bins collectively cover a total amount of charge loss). Each BFEA bin can be assigned a respective bin index representing a bin number. Illustratively, if there are N BFEA bins, then the BFEA bins can include bin 1 through bin N. For example, bin 1 can be defined for the right-most valley between a pair of $V_T$ distributions. Each bin can also be assigned a respective predefined read level offset determined in accordance with the time of programming to account for a predicted $V_T$ distribution shift over time resulting from predicted charge loss. Each read level offset can be applied to the blocks of the respective BFEA bin to address the predicted $V_T$ distribution shift.

When a block is initially programmed at time 0, the block can be initially assigned to the first bin (e.g., bin 1). A scan operation can be performed on the block periodically (e.g., every few hours) to determine whether the read level offset for the block, and thus the BFEA bin assignment, should be updated to better track $V_T$ distribution shift over time. For example, if the scan operation indicates that the read level offset should be updated to the read level offset assigned to a second bin (e.g., bin 2), then the block can be reassigned to the second bin.

In some implementations, the BFEA bins are generated in accordance with an equally spaced BFEA design. More specifically, each BFEA bin can be generated to have the same width reflecting an equal division of the measured charge loss. For example, for a TLC memory device, there can be seven BFEA bins. If the total amount of SCL in this example is 490 millivolts (mV), then each BFEA bin will be designed to cover 70 mV (i.e., 490 mV divided by 7 BFEA bins). Then, each BFEA bin can be assigned a respective read level offset.

There are some disadvantages with the equally spaced BFEA bin design described above. For example, although the equally spaced BFEA bin design considers trigger rate, it does not consider error correction decoder (e.g., LDCP decoder) throughput for addressing errors. Error correction throughput can be inversely proportional to bit error rate (e.g., RBER), meaning that a higher error rate translates into lower error correction throughput. Thus, an error correction decoder throughput specification can be defined by a threshold bit error rate defining a bit error rate limit. Error correction decoder throughput can have a greater impact on system performance than trigger rate, and thus it may be more beneficial to focus on improving error correction decoder throughput to improve overall system performance. Thus, even if the trigger rate is sufficiently low using the equally spaced BFEA bin design, the error correction decoder throughput can itself be low.

As another example, since the total amount of charge loss can be predefined in view of the time and/or temperature, the BFEA bins generated to cover the measured amount of charge loss can exceed intrinsic memory device capability regarding charge loss. This situation can result in a system efficiency and performance penalty. Alternatively, it is also possible for the BFEA bins generated to cover the measured amount of charge loss can be too low relative to the intrinsic memory device capability regarding SCL. This situation can lead to over-refresh performed by the system.

As yet another example, the equally spaced BFEA bin design does not take into account reduction of read window width over time. For example, a read window for cells of a block can be highest immediately after programming, and the read window can gradually decrease over time as a function of the elapsed time since programming. Thus, the equal width of BFEA bins achieved under the equally spaced BFEA bin design may become misaligned with respect to read window changes over time.

As yet another example, BFEA bin selection occurs at discrete time intervals since no host communication is allowed during BFEA bin selection. However, charge loss is a continuous physical mechanism. The equally spaced BFEA bin design can suffer from large read window overlaps between BFEA bins (e.g., BFEA bins with lower index values) and/or read window gaps between BFEA bins (e.g., BFEA bins with higher index values).

Aspects of the present disclosure address the above and other deficiencies by implementing BFEA bin designs addressing error correction decoder throughput specifications. Embodiments described herein can be used to obtain a BFEA bin design that can achieve an error correction decoder (e.g., LDPC decoder) throughput specifications defined by a threshold bit error rate (e.g., RBER). More specifically, the number of BFEA bins and corresponding read level offsets of BFEA bins generated in accordance with the BFEA bin design can be determined to achieve the error correction decoder throughput specification. Accordingly, BFEA bins generated in accordance with the BFEA bin design described herein can thus achieve a more optimal division of charge loss for defining BFEA bins, as compared to the equally spaced BFEA bin design.

Generating the BFEA bins can include determining, for each BFEA bin, a read window for achieving an error correction decoder throughput specification. A read window for a BFEA bin can be determined relative to a center read level within a valley between a pair of $V_T$ distributions including a left $V_T$ distribution and a right $V_T$ distribution. That is, the read window defines a width of the valley between the pair of $V_T$ distributions. For example, a left portion of the read window can be defined between a boundary of the left $V_T$ distribution and the center read level, and a right portion of the read window can be defined between a boundary of the right $V_T$ distribution and the center read level. Determining a read window for a BFEA bin can include determining a position of the boundary of the left $V_T$ distribution with respect to the left $V_T$ distribution that results in the threshold bit error rate, and determining the position of the boundary of the right $V_T$ distribution with respect to the right $V_T$ distribution that results in the threshold bit error rate. As $V_T$ distribution shift occurs as a result of charge loss over time, the $V_T$ distributions can shift toward the left. Thus, to keep the bit error rate less than or equal to the threshold bit error rate, at least one of the boundaries can be adjusted from bin-to-bin to update the read window. Further details regarding this process will be described below with reference to FIGS. 3A-3B.

The bin width of each BFEA bin can be a function of bin index. For example, a BFEA bin with the lowest bin index (e.g., bin 1) can have the largest bin width representing a largest portion of the measured charge loss, while a BFEA bin with the highest bin index (e.g., bin N) can have the smallest bin width representing a smallest portion of the measured charge loss. Embodiments described herein can generate and utilize a fewer number of BFEA bins and corresponding read level offsets as compared to the equally spaced BFEA design, which can lead to improved system efficiency and performance (e.g., reduced implementation cost and/or complexity reduction). For example, a BFEA bin design described herein can include four BFEA bins to cover the same amount of charge loss as seven bins of the equally spaced BFEA bin design.

A read window defined for a BFEA bin can be determined empirically by performing read voltage window measurements with respect to a number of pages of a block, and selecting the minimum read voltage window measurement as the read window. However, it may not be efficient to perform such measurements for every page of the block. Thus, there may be situations in which a page has a read voltage window measurement that is less than the minimum read voltage window measurement that was empirically determined. To account for this possibility, a read window overlap can be defined between read windows defined for adjacent BFEA bins. The read window overlap can improve performance by minimizing situations in which there is missed read window coverage. There can be an inverse relationship between the proportion of pages that are measured and the size of the read window overlap. More specifically, the fewer number of pages of a block that are measured relative to the total number of pages of the block, the larger the size of the read window overlap.

The method can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and increase in transfer rate as compared to the FG NAND architecture. Further details regarding implementing BFEA bin designs addressing error correction decoder throughput specifications will be described below with reference to FIGS. 1A-6.

Advantages of the present disclosure include, but are not limited to, improved memory device performance and reliability. For example, embodiments described herein can achieve improved performance consistency and/or throughput across SCL conditions. Accordingly embodiments described herein can be implemented to reduce read errors and increase the life of a memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a block family error avoidance (BFEA) component 137. The BFEA component 137 can receive a set of bins. The set of bins can be predefined and stored on the local media controller 135. Each bin of the set of bins corresponds to a grouping of blocks of the memory device 130. Each bin of the set of bins is assigned with a respective read level offset.

The local media controller 135 can maintain a set of bins. For example, the local media controller 135 can receive and store the set of bins. Each bin of the set of bins defines a respective grouping of blocks (e.g., memory arrays) of the memory device 130. Each block of the memory device is assigned to a respective bin based on an amount of charge loss determined (e.g., predicted) for the block. For example, the amount of charge loss of a block can be determined based on elapsed time since programming of the block. Moreover, each bin of the set of bins can be assigned a respective read level offset that can be used to read the blocks assigned to the bin. Maintaining the set of bins can include updating the set of bins. For example, a periodic scan operation can be performed for a block to determine whether to reassign the block to another bin.

Generating the set of bins can include determining, for each bin, a read window for achieving an error correction decoder throughput specification. A read window for a BFEA bin can be determined relative to a center read level within a valley between a pair of $V_T$ distributions including a left $V_T$ distribution and a right $V_T$ distribution. That is, the read window defines a width of the valley between the pair of $V_T$ distributions. For example, a left portion of the read window can be defined between a boundary of the left $V_T$ distribution and the center read level, and a right portion of the read window can be defined between a boundary of the right $V_T$ distribution and the center read level. Determining a read window for a bin can include determining a position of the boundary of the left $V_T$ distribution with respect to the left $V_T$ distribution that results in the threshold bit error rate, and determining the position of the boundary of the right $V_T$ distribution with respect to the right $V_T$ distribution that results in the threshold bit error rate. As $V_T$ distribution shift occurs as a result of charge loss over time, the $V_T$ distributions can shift toward the left. Thus, to keep the bit error rate less than or equal to the threshold bit error rate, at least one of the boundaries can be adjusted from bin-to-bin to update the read window.

A read window defined for a bin can be determined empirically by performing read voltage window measurements with respect to a number of pages of a block, and selecting the minimum read voltage window measurement as the read window. However, it may not be efficient to perform such measurements for every page of the block. Thus, there may be situations in which a page has a read voltage window measurement that is less than the minimum read voltage window measurement that was empirically determined. To account for this possibility, a read window overlap can be defined between read windows defined for adjacent bins. The read window overlap can improve performance by minimizing situations in which there is missed read window coverage. There can be an inverse relationship between the proportion of pages that are measured and the size of the read window overlap. More specifically, the fewer number of pages of a block that are measured relative to the total number of pages of the block, the larger the size of the read window overlap.

The bin width of each bin can be a function of bin index. For example, a bin with the lowest bin index (e.g., bin 1) can have the largest bin width representing a largest portion of the measured charge loss, while a BFEA bin with the highest bin index (e.g., bin N) can have the smallest bin width representing a smallest portion of the measured charge loss. The set of bins can include any suitable number of bins. For example, the set of bins can include four bins.

The local media controller can receive a request to perform a read operation with respect to the block. For example, the request can be received from the host system 120 via the memory sub-system controller 115. Upon receiving the request, the BFEA component 137 can select a read level offset for the block. More specifically, the BFEA component 137 can identify the bin of the set of bins to which the block is assigned to, and select the read level offset assigned to the block. Further details regarding the operations of the BFEA component 137 will be described below with reference to FIGS. 3-5.

Figure 1B:
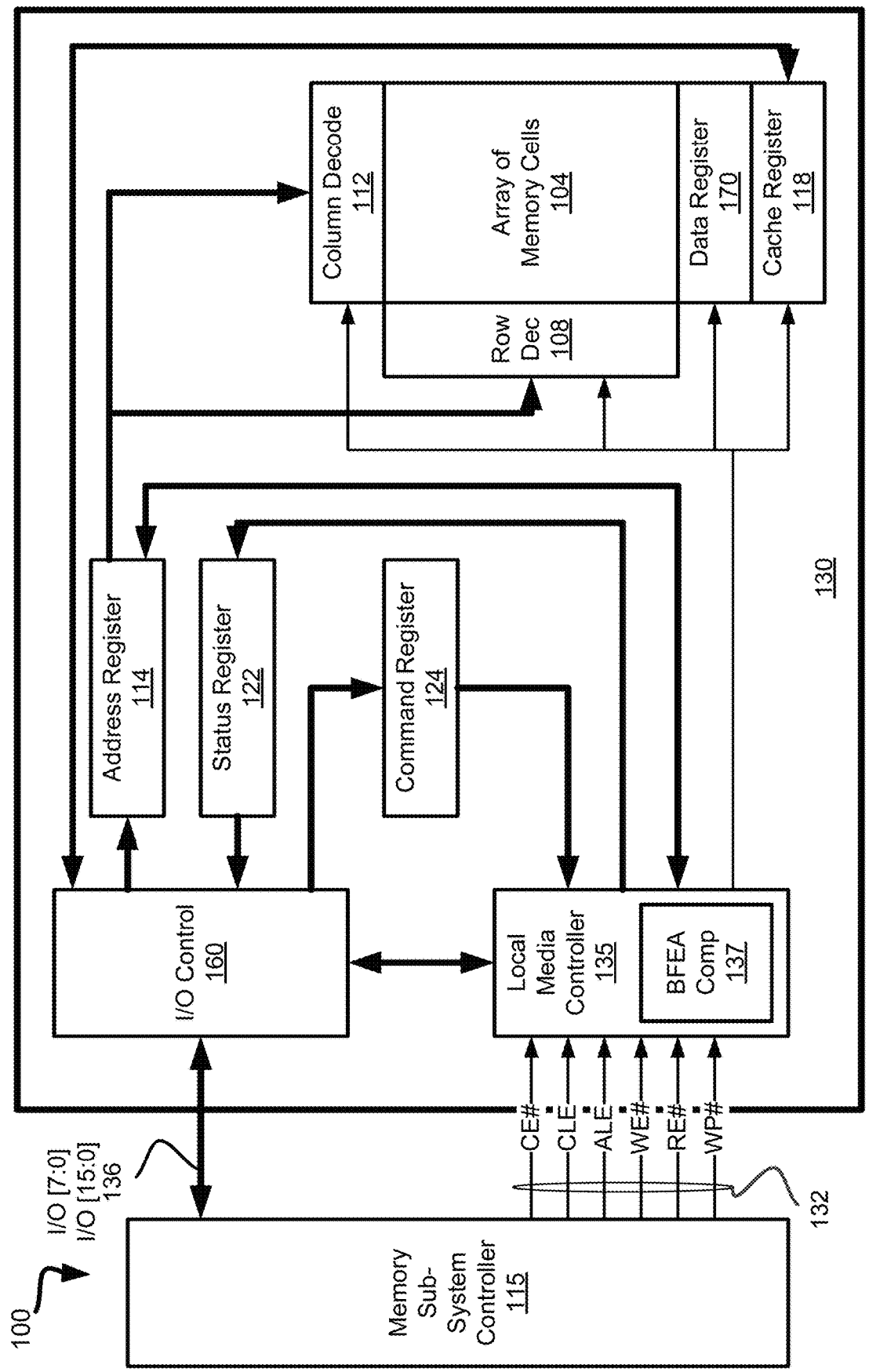
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the BV component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
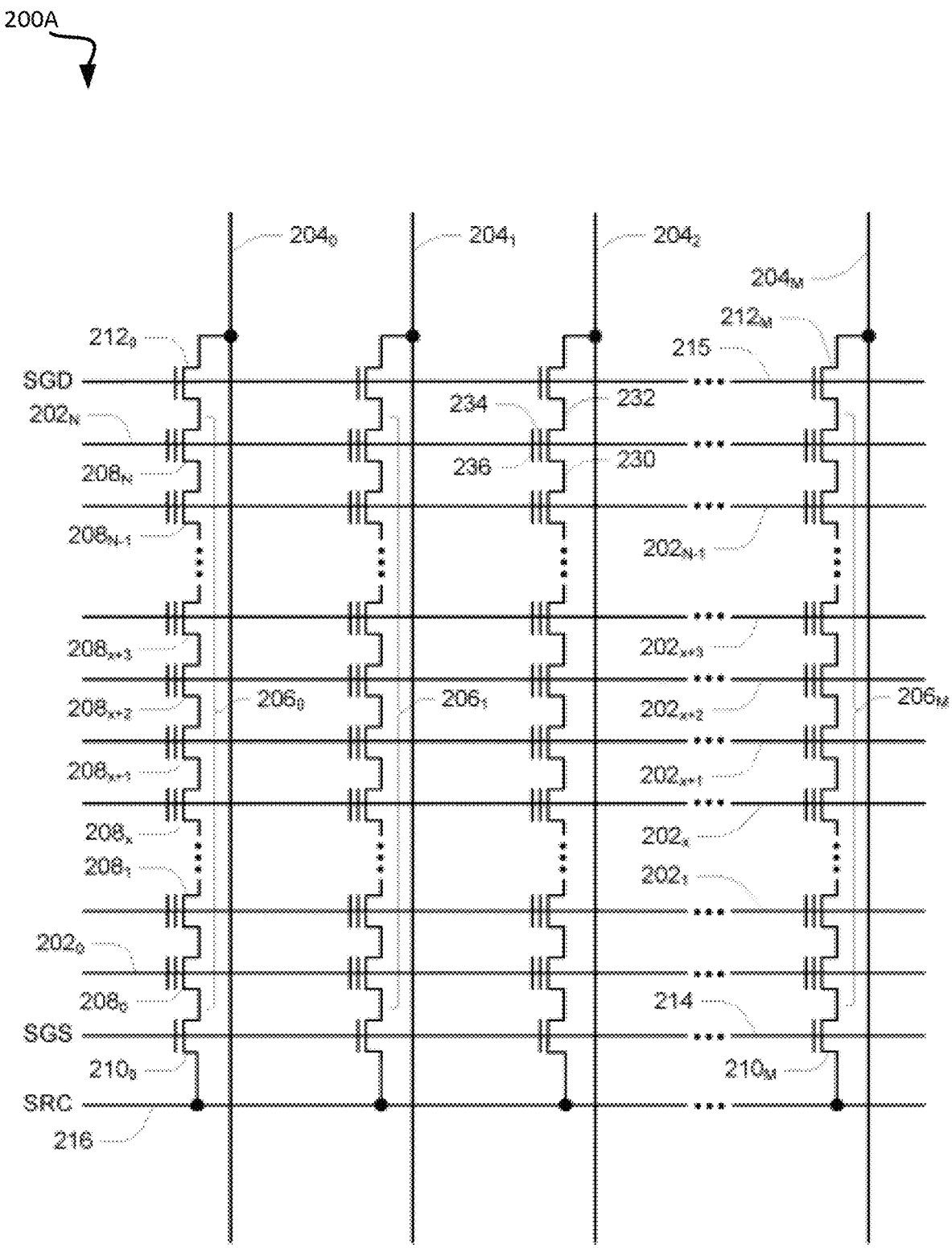
FIGS. 2A-2C are diagrams of portions of an example array of memory cells included in a memory device, in accordance with some embodiments of the present disclosure.
Figure 2B:
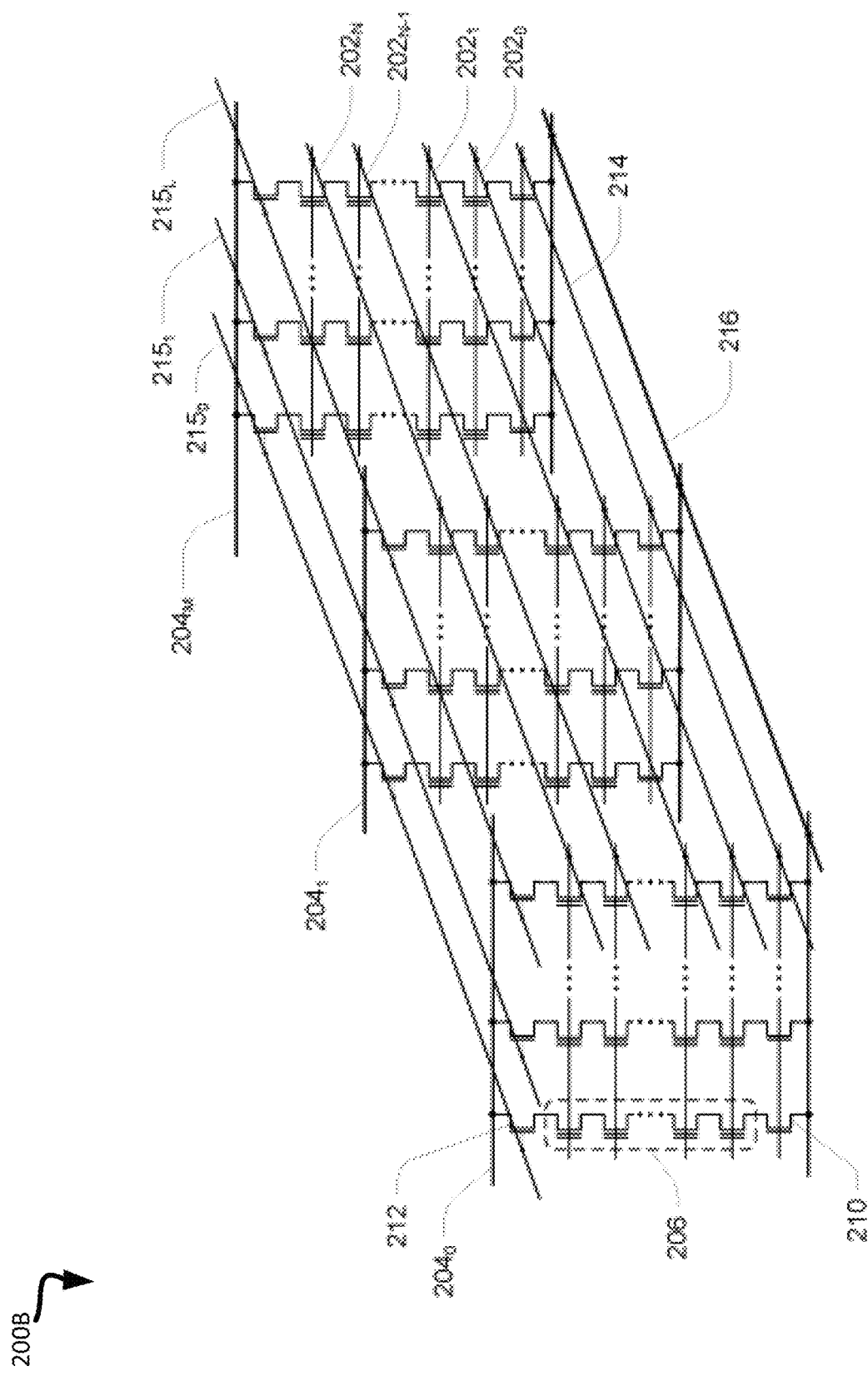
Figure 2C:
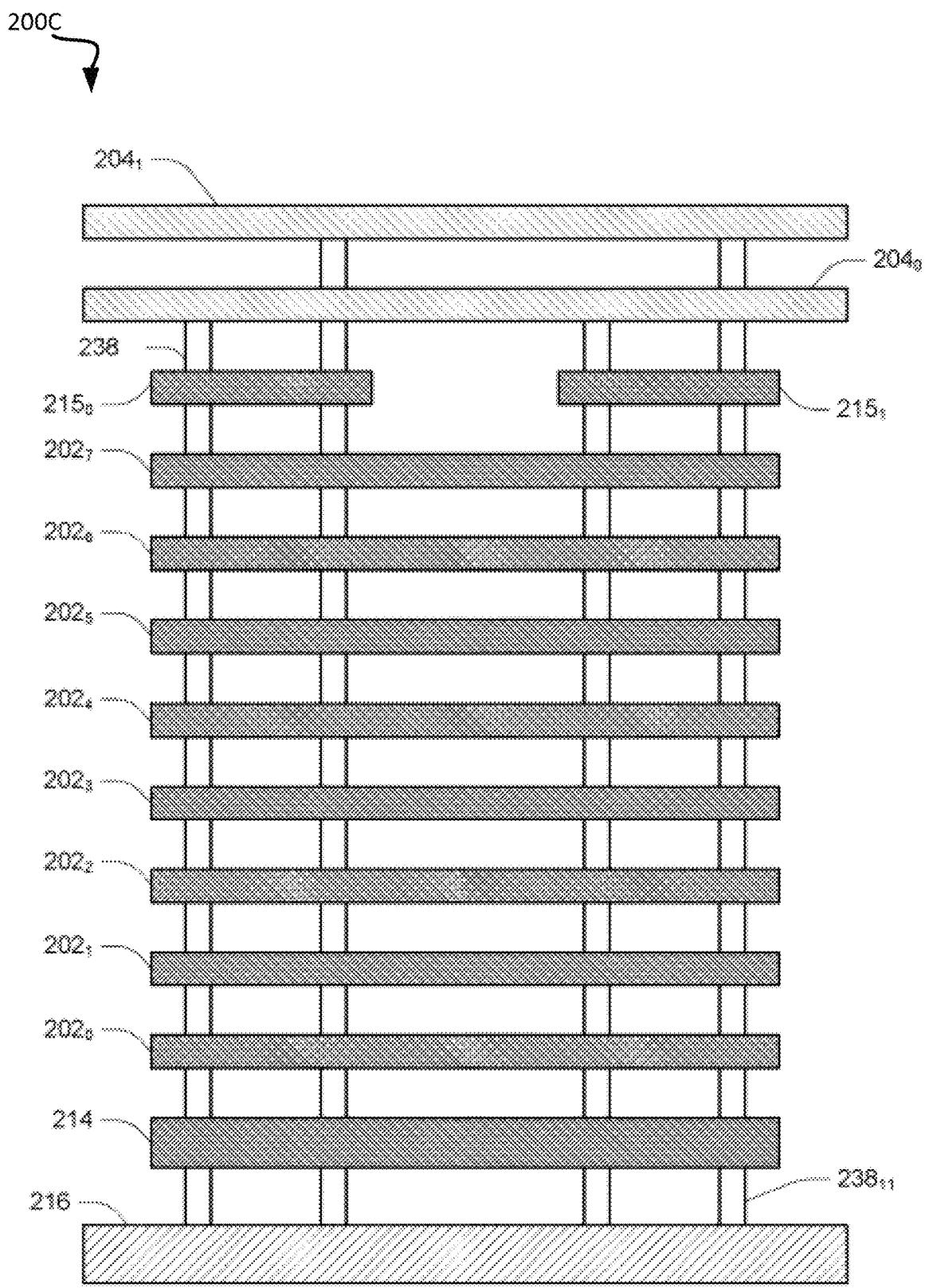

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly addressable by a given wordline 202. For example, memory cells 208 commonly addressable by wordline $202_N$ and selectively connected to even bitlines 204 (e.g., bitlines $204_0, 204_2, 204_4$, etc.) may be one physical page of memory cells 208 (e.g., even memory cells) while memory cells 208 commonly addressable by wordline $202_N$ and selectively connected to odd bitlines 204 (e.g., bitlines $204_1, 204_3, 204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly addressable by a given wordline 202 may also define a physical page of memory cells 208. For certain memory devices, all memory cells commonly addressable by a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells addressable by wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines 2150-215L to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly addressable by each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) 238 represent the channel regions of different strings of series-connected memory cells (e.g., strings 206 of FIGS. 2A-2B) selectively connected to the bitline $204_0$ and/or bitline $204_1$. A memory cell (not depicted in FIG. 2C) may be formed at each intersection of a wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

FIGS. 3A-3B are diagrams of $V_T$ distributions illustrating an example implementation of BFEA bin designs based on parity check throughput specifications, in accordance with some embodiments of the present disclosure. For example, FIG. 3A illustrates a diagram 300A of a left $V_T$ distribution 310L and a right $V_T$ distribution 310R at a first time. For example, the first time can be the time of programming (e.g., time 0). A center read level 320 can exist in the valley between the $V_T$ distributions 310L and 310R. The valley defines a read window. A boundary 330 L can be identified for the left $V_T$ distribution 310L and a boundary 330R-1 can be identified for the right $V_T$ distribution 310R. The distance between the center read level 320 and the boundary 330L defines a left portion of the read window 340L. The boundaries 340L-1 and 340R-1 can each be identified from a threshold bit error rate (e.g., RBER). The threshold bit error rate is correlated with an error correction decoder (e.g., LDPC decoder) throughput specification. The boundaries 340L-1 and 340R-1 can be identified empirically by analyzing charge loss after memory device manufacture. A distance between the center read level 320 and the boundary 340R-1 defines a right portion of the read window 340R-1.

FIG. 3B illustrates a diagram 300B of the left $V_T$ distribution 310L and the right $V_T$ distribution 310R at a second time after the first time. Due to charge loss that occurred between the first time and the second time, at least the right $V_T$ distribution 310R shifted to the left. If the boundary 330R-1 from FIG. 3A remains at the same position, this would result in a bit error rate that exceeds the threshold bit error rate. Thus, to address the shift of the right $V_T$ distribution 310R caused by the charge loss, the boundary 330R-1 is updated to boundary 330R-2, which results in an updated distance between the center read level 320 and the boundary 330R-2 defining a right portion of the read window 340R-2. The updated distance is smaller than the previous distance, and thus the right portion of the read window 340R-2 is smaller than the right portion of the read window 340R-1. Moreover, the read window itself has been reduced due to the shift of the right $V_T$ distribution 310R.

FIG. 4 is a diagram 400 of an example bin design layout for addressing error correction decoder throughput specifications, in accordance with some embodiments of the present disclosure. As shown, the diagram 400 illustrates a set of bins including bin 1 410-1 through bin N 410-N. That is, the set of bins can include N bins. In some embodiments, the set of bins includes a number of bins less than or equal to seven (e.g., in a TLC implementation). For example, in a TLC implementation, the number of bins can be four bins. The width of each of the bins represents a respective portion of total charge loss. Instead of each bin having an equal width, the width of each of the bins can vary depending on the bin index, where each bin index corresponds to a respective read window defining a valley between a pair of $V_T$ distributions. For example, as shown, bin width can be inversely proportion to bin index, such that bin 1 410-1 has the greatest width and bin N 410-N has the smallest width. Read window overlaps can exist between adjacent bins to address uncertainty due to not analyzing every page of the block during the empirical analysis used to generate the set of the bins. For example, a read window overlap 420-1 can exist between bin 1 410-1 and bin 2 410-2, and a read window overlap 420-2 can exist between bin 2 410-2 and bin 3 410-3.

Figure 5A:
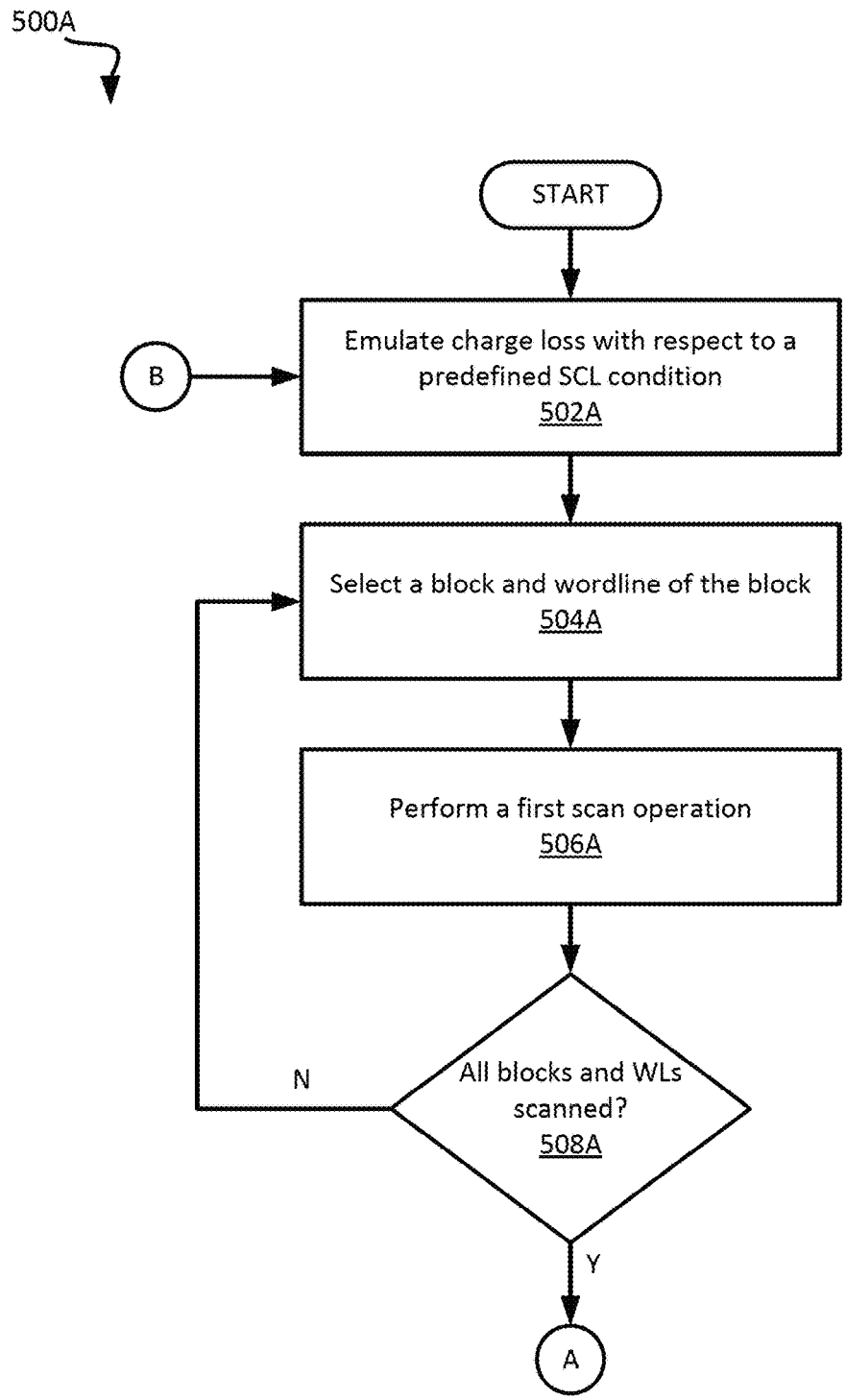
FIG. 5A is a flow diagram of an example method to implement block family error avoidance (BFEA) bin designs addressing error correction decoder throughput specifications, in accordance with some embodiments of the present disclosure.
Figure 5A:
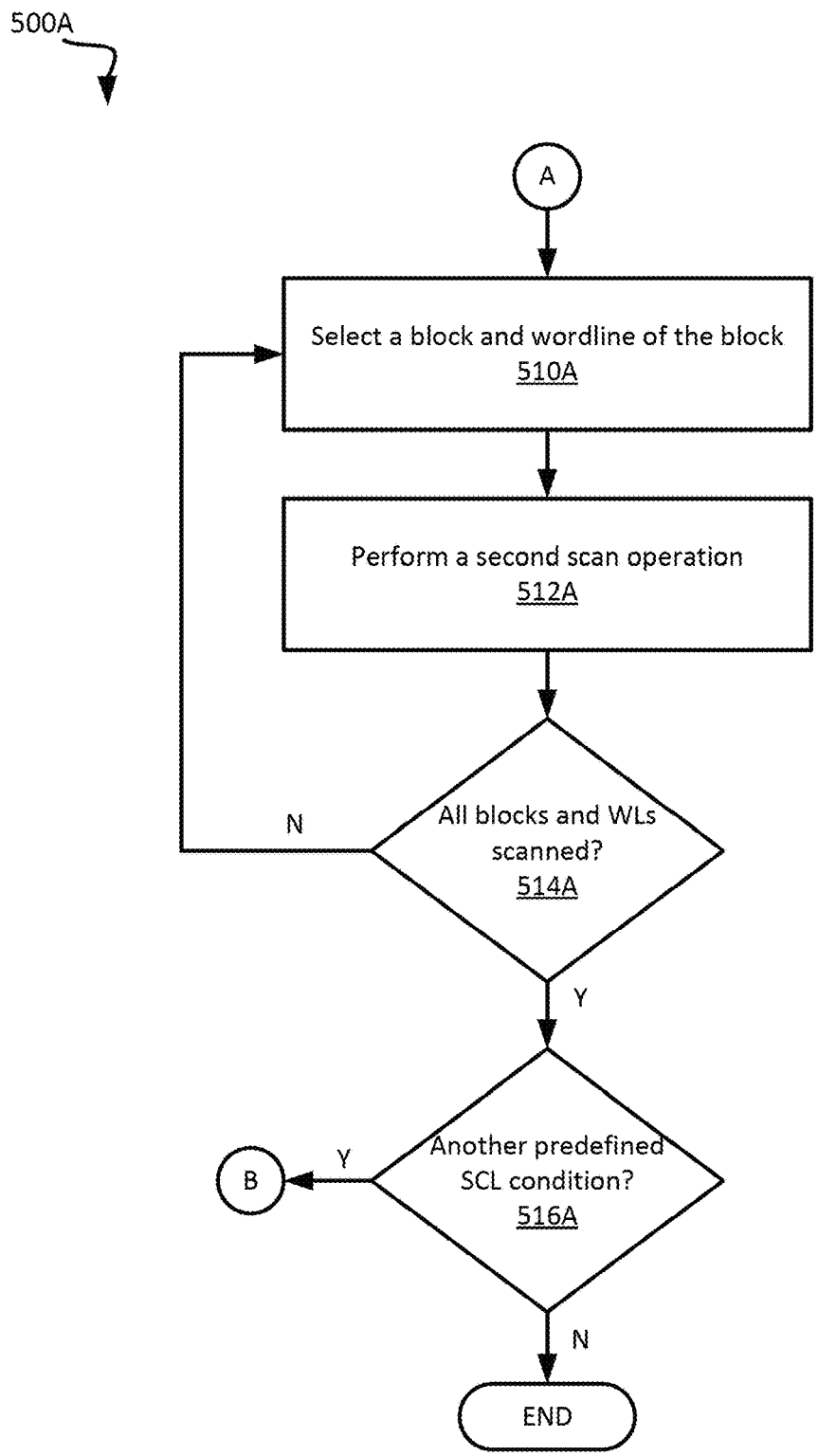

FIG. 5A is a flow diagram of an example method 500A to implement BFEA bin designs based on parity check throughput specifications, in accordance with some embodiments of the present disclosure. The method 500A can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 502A, SCL is emulated with respect to a predefined SCL condition. For example, the predefined SCL condition can include an amount of time and/or a temperature for storing a memory device (i.e., baking), and emulating SCL can include storing the memory device in accordance with the predefined condition. Examples of predefined SCL conditions include an initial time (i.e., time zero), a first amount of time after the initial time at a temperature (e.g., storing the memory device for one day at the temperature), a second amount of time after the initial time (e.g., storing the memory device for two days at the temperature), etc. Prior to emulating SCL at operation 502A, a pattern can be defined for the initial time (i.e., time zero pattern) that covers a number of physical locations, such as blocks and/or wordlines (WLs) of respective blocks.

At operation 504A, a block and wordline (WL) of the block are selected. For example, control logic can receive a selection of the block and WL. At operation 506A, a first scan operation is performed. For example, control logic can scan the block and the wordline to obtain a first direction bit error metric by moving the read level to a first direction (e.g., to the right). In some embodiments, the first direction bit error metric is a bit error rate (e.g., RBER). The first direction bit error metric can be compared to a first threshold bit error metric defined for an error correction decoder (e.g., LDPC) throughput specification. If the first direction bit error metric is less than or equal to the first threshold bit error metric, then the read level can be moved again in the first direction to obtain an updated first direction bit error metric. If the first direction bit error metric is greater than the first threshold bit error metric, then the read level offset for the read level can be recorded to complete the first scan operation for the current block and wordline.

At operation 508A, it is determined whether all of the blocks and WLs have been scanned. For example, control logic can determine whether the first scan operation has been performed for all of the blocks and WLs. For example, control logic can receive an indication that there are no remaining blocks and WLs for performing the first scan operation. If not, the process can revert back to operation 504A to select another block and/or WL of the block. Otherwise, the first scan operation is determined to be complete. At operation 510A, a block and wordline of the block can be selected. For example, control logic can receive a selection of the block and WL.

At operation 512A, a second scan operation is performed. For example, control logic can scan the block and the wordline to obtain a second direction bit error metric (e.g., RBER) by moving the read level to a second direction (e.g., to the left). The second direction bit error metric can be compared to a second threshold bit error metric defined for an error correction decoder (e.g., LDPC) throughput specification. In some embodiments, the second threshold bit error metric is the same as the first threshold bit error metric. In some embodiments, the second threshold bit error metric is different from the first threshold bit error metric. If the second direction bit error metric is less than or equal to the second threshold bit error metric, then the read level can be moved again in the second direction to obtain an updated second direction bit error metric. If the second direction bit error metric is greater than the second threshold bit error metric, then the read level offset for the read level can be recorded to complete the second scan operation for the current block and wordline.

At operation 514A, it is determined whether all of the blocks and WLs have been scanned. For example, control logic can determine whether the second scan operation has been performed for all of the blocks and WLs. For example, control logic can receive an indication that there are no remaining blocks and WLs for performing the second scan operation. If not, the process can revert back to operation 510A to select another block and/or WL of the block. Otherwise, the second scan operation is determined to be complete. At operation 516A, it is determined whether there is at least one remaining predefined SCL condition. If so, the process can revert back to operation 502A to emulate charge loss with respect to another predefined SCL condition. If there are no remaining predefined SCL conditions, then the characterization of all predefined SCL conditions is complete and the process can end.

Figure 5B:
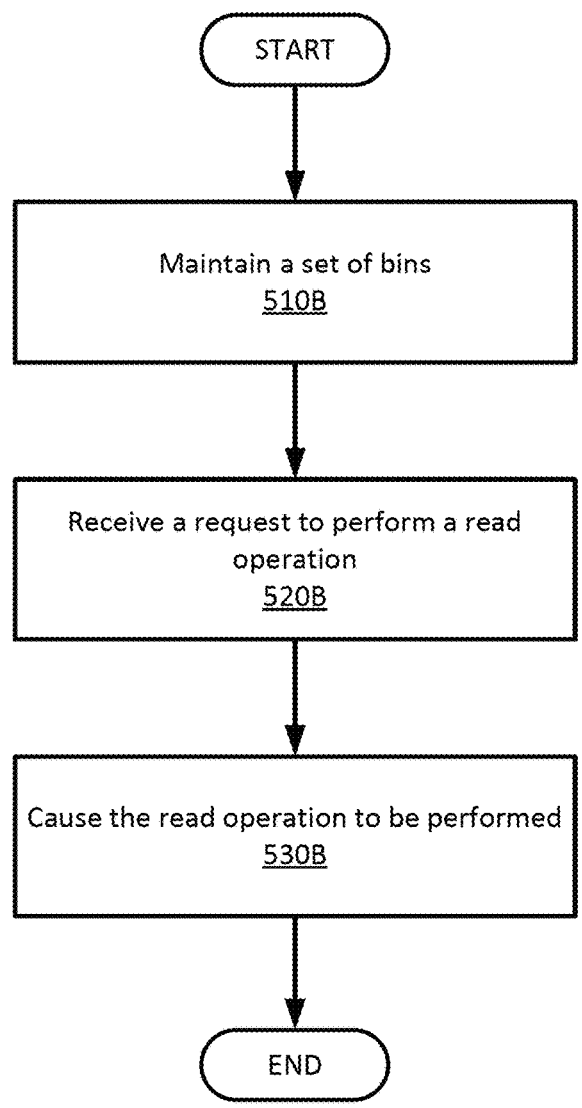
FIG. 5B is a flow diagram of an example method to implement block family error avoidance (BFEA) bin designs addressing error correction decoder throughput specifications, in accordance with some embodiments of the present disclosure.

FIG. 5B is a flow diagram of an example method 500B to implement BFEA bin designs based on parity check throughput specifications, in accordance with some embodiments of the present disclosure. The method 500B can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500B is performed by the BFEA component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510B, a set of bins is maintained. For example, control logic can receive and store the set of bins. Each bin of the set of bins defines a respective grouping of memory arrays of a memory device (e.g., memory device 130 of FIGS. 1A-1B). For example, a memory array can be the memory array 104 of FIG. 1B. Each memory array is assigned to a respective bin based on an elapsed time since programming, which can be correlated to an amount of charge loss determined (e.g., predicted) for the memory array. Moreover, each bin of the set of bins can be assigned a respective read level offset that can be used to read the memory arrays assigned to the bin. Maintaining the set of bins can include updating the set of bins. For example, the set of bins can be updated periodically by performing a periodic scan operation to determine whether to reassign the memory array to another bin.

Generating the set of bins can include determining, for each bin, a read window for achieving an error correction decoder throughput specification. A read window for a BFEA bin can be determined relative to a center read level within a valley between a pair of $V_T$ distributions including a left $V_T$ distribution and a right $V_T$ distribution. That is, the read window defines a width of the valley between the pair of $V_T$ distributions. For example, a left portion of the read window can be defined between a boundary of the left $V_T$ distribution and the center read level, and a right portion of the read window can be defined between a boundary of the right $V_T$ distribution and the center read level. Determining a read window for a bin can include determining a position of the boundary of the left $V_T$ distribution with respect to the left $V_T$ distribution that results in the threshold bit error rate, and determining the position of the boundary of the right $V_T$ distribution with respect to the right $V_T$ distribution that results in the threshold bit error rate. As $V_T$ distribution shift occurs as a result of charge loss over time, the $V_T$ distributions can shift toward the left. Thus, to keep the bit error rate less than or equal to the threshold bit error rate, at least one of the boundaries can be adjusted from bin-to-bin to update the read window.

A read window defined for a bin can be determined empirically by performing read voltage window measurements with respect to a number of pages of a memory array, and selecting the minimum read voltage window measurement as the read window. However, it may not be efficient to perform such measurements for every page of the memory array. Thus, there may be situations in which a page has a read voltage window measurement that is less than the minimum read voltage window measurement that was empirically determined. To account for this possibility, a read window overlap can be defined between read windows defined for adjacent bins. The read window overlap can improve performance by minimizing situations in which there is missed read window coverage. There can be an inverse relationship between the proportion of pages that are measured and the size of the read window overlap. More specifically, the fewer number of pages of a memory array that are measured relative to the total number of pages of the memory array, the larger the size of the read window overlap.

The bin width of each bin can be a function of bin index. For example, a bin with the lowest bin index (e.g., bin 1) can have the largest bin width representing a largest portion of the measured charge loss, while a BFEA bin with the highest bin index (e.g., bin N) can have the smallest bin width representing a smallest portion of the measured charge loss.

The set of bins can include any suitable number of bins. For example, the set of bins can include four bins.

At operation 520B, a request to perform a read operation is received. For example, control logic can receive the request to perform the read operation from a host system (e.g., host system 120 of FIG. 1A) via a memory sub-system controller (e.g., memory sub-system controller 115 of FIGS. 1A-1B). More specifically, the read operation can address a memory of a memory device (e.g., memory array 104 of memory device 130 of FIGS. 1A-1B).

At operation 530B, the read operation is performed. For example, control logic can cause the read operation to be performed based on the set of bins. Causing the read operation to be performed can include identifying the bin of the set of bins to which the memory array is assigned, selecting the read level offset of the bin to which the memory array is assigned as a selected read offset, and performing the read operation using the selected read level offset. Performing the read operation using the selected read level offset can include applying the read level offset with respect to a reference read voltage to account for the predicted charge loss over time (as indicated by the bin to which the memory array is assigned). Further details regarding operations 510-540 are described above with reference to FIGS. 1A and 3A-4.

Figure 6:
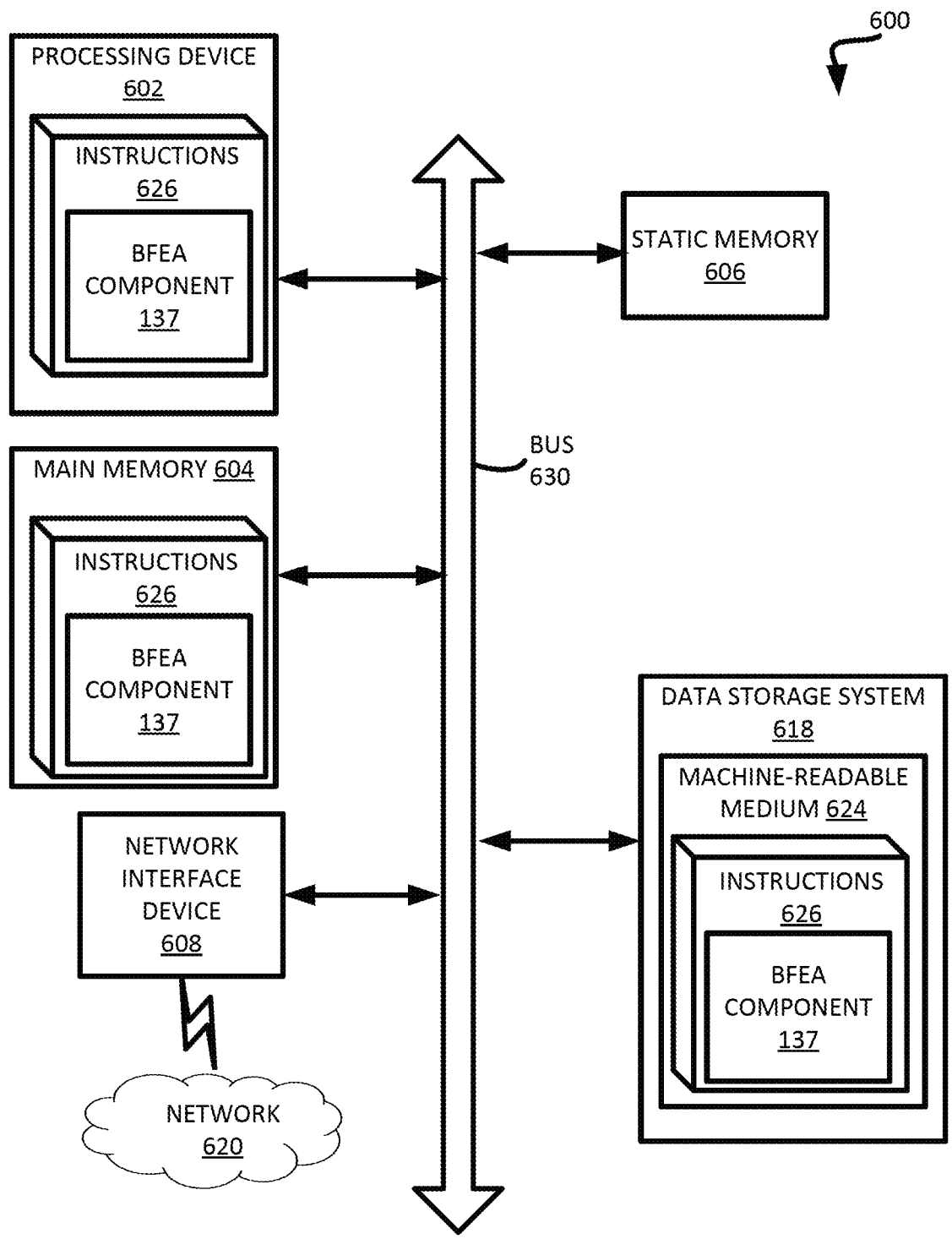
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the BFEA component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to a BFEA component (e.g., the BFEA component 137 of FIG. 1A). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array; and
    control logic, operatively coupled with the memory array, to perform operations comprising:
        maintaining a set of bins, each bin of the set of bins defining a respective grouping of blocks of memory cells in the memory array based on elapsed time since programming, wherein each bin of the set of bins is assigned a respective read level offset to achieve a bit error rate satisfying a threshold condition for an error correction decoder throughput specification, wherein the set of bins comprises a first bin and a second bin having an associated read window overlap between a first read window defined for the first bin and a second read window defined for the second bin, and wherein the first read window and the second read window correspond to respective valley margins between respective pairs of adjacent threshold voltage distributions;

receiving a request to perform a read operation addressing a block of the grouping of blocks of memory cells assigned to the first bin; and causing the read operation addressing the block to be performed based on the respective read level offset assigned to the first bin.

2. The memory device of claim 1, wherein maintaining the set of bins comprises receiving a predefined set of bins, and storing the predefined set of bins as the set of bins.

3. The memory device of claim 1, wherein maintaining the set of bins comprises updating the set of bins by performing a scan operation to determine whether to reassign the block from the first bin to another bin of the set of bins.

4. The memory device of claim 1, wherein causing the read operation addressing the block to be performed comprises identifying the first bin to which the block is assigned, and selecting the respective read level offset assigned to the first bin as a selected read level offset.

5. The memory device of claim 4, wherein causing the read operation addressing the block to be performed further comprises performing the read operation addressing the block using the selected read level offset.

6. The memory device of claim 1, wherein the first bin has a first width and the second bin has a second width different from the first width.

7. The memory device of claim 6, wherein the first bin has a lower bin index than the second bin, and wherein the first width is greater than the second width.

8. A method comprising:
maintaining, by a processing device, a set of bins, each bin of the set of bins defining a respective grouping of blocks of memory cells in a memory array based on elapsed time since programming, wherein each bin of the set of bins is assigned a respective read level offset to achieve a bit error rate satisfying a threshold condition for an error correction decoder throughput specification, wherein the set of bins comprises a first bin and a second bin having an associated read window overlap between a first read window defined for the first bin and a second read window defined for the second bin, and wherein the first read window and the second read window correspond to respective valley margins between respective pairs of adjacent threshold voltage distributions;
receiving, by the processing device, a request to perform a read operation addressing a block of the grouping of blocks of memory cells assigned to the first bin; and
causing, by the processing device, the read operation addressing the block to be performed based on the respective read level offset assigned to the first bin.

9. The method of claim 8, wherein maintaining the set of bins comprises receiving a predefined set of bins, and storing the predefined set of bins as the set of bins.

10. The method of claim 8, wherein maintaining the set of bins comprises updating the set of bins by performing a scan operation to determine whether to reassign the block from the first bin to another bin of the set of bins.

11. The method of claim 8, wherein causing the read operation addressing the block to be performed comprises identifying the first bin to which the block is assigned, and selecting the respective read level offset assigned to the first bin as a selected read level offset.

12. The method of claim 11, wherein causing the read operation addressing the block to be performed further comprises performing the read operation addressing the block using the selected read level offset.

13. The method of claim 8, wherein the first bin has a first width and the second bin has a second width different from the first width.

14. The method of claim 13, wherein the first bin has a lower bin index than the second bin, and wherein the first width is greater than the second width.

15. A memory device comprising:
a memory array; and
control logic, operatively coupled with the memory array, to perform operations comprising:
receiving a request to perform a read operation addressing a block of memory cells in the memory array;
in response to receiving the request, identifying a first bin of a set of bins to which the block is assigned, the first bin defining a first grouping of blocks of memory cells comprising the block based on elapsed time since programming, wherein the first bin is assigned a read level offset to achieve a bit error rate satisfying a threshold condition for an error correction decoder throughput specification, wherein the set of bins further comprises a second bin having an associated read window overlap between a first read window defined for the first bin and a second read window defined for the second bin, and wherein the first read window and the second read window correspond to respective valley margins between respective pairs of adjacent threshold voltage distributions; and
selecting the read level offset to perform the read operation address the block.

16. The memory device of claim 15, wherein the operations further comprise receiving the set of bins comprising the first bin and the second bin as a predefined set of bins, and storing the predefined set of bins.

17. The memory device of claim 16, wherein the operations further comprise updating the set of bins by performing a scan operation to determine whether to reassign the block from the first bin to another bin of the set of bins.

18. The memory device of claim 15, wherein the operations further comprise performing the read operation addressing the block using the read level offset.

19. The memory device of claim 15, wherein the first bin has a first width and the second bin has a second width different from the first width.

20. The memory device of claim 19, wherein the first bin has a lower bin index than the second bin, and wherein the first width is greater than the second width.

* * * * *